(12) United States Patent
Yamazaki

(10) Patent No.: US 7,528,016 B2
(45) Date of Patent: May 5, 2009

(54) SEMICONDUCTOR DEVICE AND MANUFACTURING METHOD THEREOF

(75) Inventor: Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 211 days.

(21) Appl. No.: 11/519,818

(22) Filed: Sep. 13, 2006

(65) Prior Publication Data
US 2007/0059871 A1    Mar. 15, 2007

(30) Foreign Application Priority Data
Sep. 14, 2005    (JP)    ............... 2005-266752

(51) Int. Cl.
*H01L 21/332*    (2006.01)
(52) U.S. Cl. ............... 438/133; 438/197; 438/270; 438/212
(58) Field of Classification Search ............... 438/212, 438/268, 270, 133, 197
See application file for complete search history.

(56) References Cited

U.S. PATENT DOCUMENTS 5,960,264 A * 9/1999 Takahashi ............... 438/133
6,551,909 B1 * 4/2003 Fujihira ............... 438/510
7,002,250 B2 * 2/2006 Hozoji et al. ............... 257/730

FOREIGN PATENT DOCUMENTS

JP    2003-78033 A    3/2003

OTHER PUBLICATIONS

J.Y. Kim et al. "The Breakthrough in Data Retention Time of DRAM Using Recess-Channel-Array Transistor (RCAT) for 88 nm Feature Size and Beyond", Symp. On VLSI Tech., pp. 11-12, 2003.

* cited by examiner

*Primary Examiner*—Thanh V Pham
*Assistant Examiner*—Caleb Henry
(74) *Attorney, Agent, or Firm*—Sughrue Mion, PLLC

(57) ABSTRACT

In a method of manufacturing a semiconductor device, a recess is formed in a semiconductor substrate. A gate insulating film is formed on a surface of the semiconductor substrate and a surface of the recess; and a gate electrode film is deposited on the gate insulating film to fill the recess. Then, a gate electrode is formed by etching the gate electrode film by using a predetermined mask, and ion implantation into the semiconductor substrate is carried out to form diffusion layers extending from the recess, before the forming a gate electrode at least.

3 Claims, 11 Drawing Sheets

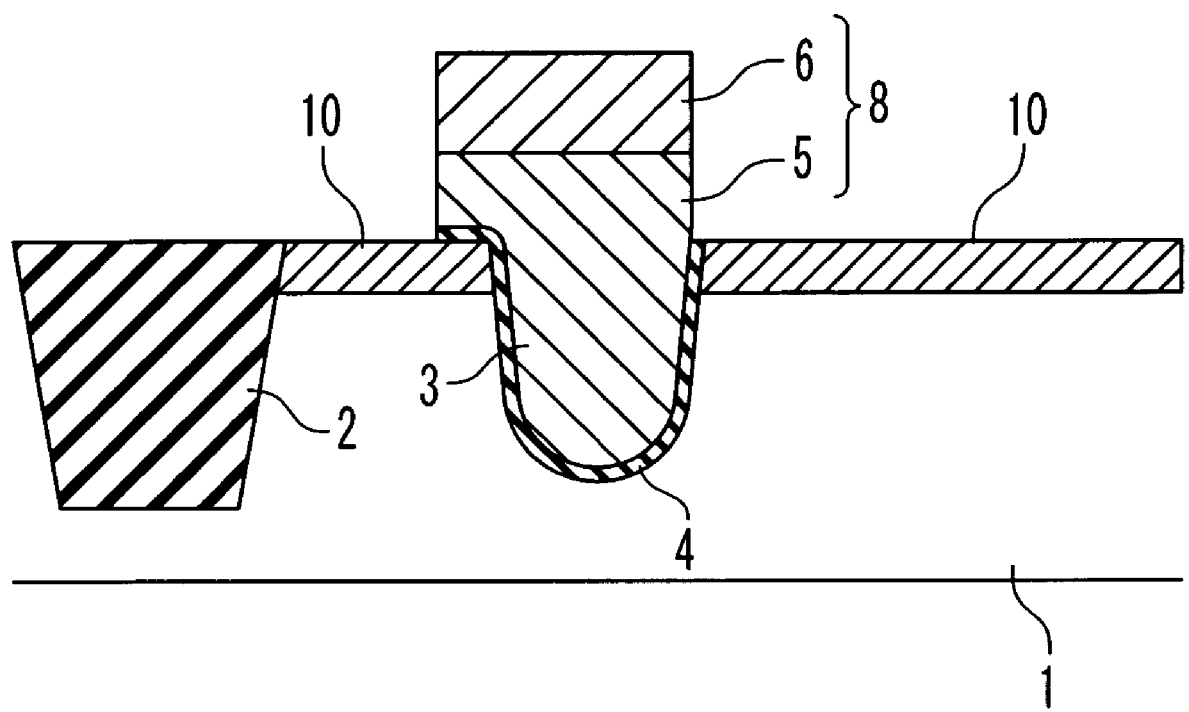

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. Particularly, the present invention relates to a recess channel transistor having a gate electrode formed in a groove and a manufacturing method thereof.

2. Description of the Related Art

A gate length of a cell transistor in a dynamic random access memory (DRAM) has been shortened with a miniaturization of a DRAM cell. When the gate length of the cell transistor is shortened, a threshold voltage Vt is decreased due to a short-channel effect. In order to keep transistor characteristics, a method is known of increasing an impurity concentration of a substrate. However, in this case, change in impurity concentration is abrupt in a junction portion, so that the intensity of an electric field applied to the junction portion is increased. This causes the increase of leakage current. The increase of the leakage current is led to the reduction of a refresh cycle $t_{REF}$, which means deterioration of a data holding characteristic.

In order to avoid the above-mentioned problems, a transistor (called a groove gate transistor and a recess channel transistor) is proposed in which the gate electrode is formed to fill a groove (recess) formed in a semiconductor substrate, as described in "The Breakthrough in data retention time of DRAM using Recess-Channel-Array Transistor (RCAT) for 88 nm feature size and beyond" by J. Y. KIM et al, (Symp. on VLSI Tech., pp. 11-12, 2003). In this case, a channel is formed along a bottom substrate of the recess. Therefore, a substantial channel length can be elongated and suppression of the short-channel effect can be realized.

Also, a semiconductor device of a conventional example is disclosed in Japanese Laid Open Patent Application (JP-P2003-78033A). In the semiconductor device of this conventional example, a gate electrode is formed in the groove in the semiconductor substrate via a gate insulating film. Side walls of an insulating film are formed in an upper portion of the groove to be thicker than the gate insulating film. The gate electrode is formed in a bottom portion of the groove, i.e., downwardly from bottom ends of the side walls. An upper surface of the gate electrode is positioned lower than a substrate surface.

A method of manufacturing a general recess channel transistor will be described with reference to FIGS. 1A to 1E. As shown in FIG. 1A, an element isolation structure 102 such as an STI (Shallow Trench Isolation) structure is first formed in a semiconductor substrate 101. Then, a recess 103 of a groove shape is formed in a predetermined region of the semiconductor substrate 101 as shown in FIG. 1B. A region where this recess 103 is formed represents a channel region of a transistor. Then, a gate insulating layer 104 is formed on a whole surface. Then, as shown in FIG. 1C, a gate polysilicon film 105 and a gate silicide film 106 are deposited on the gate insulating film 104 in this order. The gate silicide film 106 is exemplified by a tungsten silicide (WSi) film.

Next, as shown in FIG. 1D, a resist mask 107 for the gate electrode is formed on the gate silicide film 106. The resist mask 107 is formed on a channel region in which the recess 103 is formed. A displacement is present in position adjustment between the resist mask 107 and the channel region. As a result, as shown in FIG. 1E, the displacement exists between a position of a gate electrode 108 after an etching process and a position of the recess 103. Such a gate electrode 108 is used as a mask in an impurity ion implantation process to form diffusion layers (source/drain regions) 109 in the substrate 101. This will result in generation of an offset region 110 and a slit region 111 as shown in FIG. 1E. The offset region 110 is a region produced in the substrate 101 between the diffusion layer 109 and the recess 103, in which the impurity ions are not implanted. Meanwhile, the slit region 111 is a space produced in the recess 103 between the gate electrode 108 and the recess 103. FIG. 2 is a plan view showing a recess channel transistor formed as mentioned above. A cross section along A-A' line in FIG. 2 is shown in FIG. 1E.

The offset region 110 and the slit region 111 degrade the transistor performance. Also, they cause a deviation in the threshold voltage Vt and a junction leakage current. Therefore, a technique is demanded which can prevent deterioration in characteristics of the recess channel transistor.

SUMMARY OF THE INVENTION

It is an object of the present invention to provide a technique for preventing deterioration in characteristics of a recess channel transistor.

Another object of the present invention is to provide a technique for adjusting a position of a recess (channel) and a position of a diffusion layer in a recess channel transistor.

In an aspect of the present invention, a method of manufacturing a semiconductor device is achieved by forming a recess in a semiconductor substrate; by forming a gate insulating film on a surface of the semiconductor substrate and a surface of the recess; by depositing a gate electrode film on the gate insulating film to fill the recess; by forming a gate electrode by etching the gate electrode film by using a predetermined mask; by carrying out ion implantation into the semiconductor substrate to form diffusion layers extending from the recess, before the forming a gate electrode at least.

Here, the ion implantation may be carried out before the forming a recess, and a region where the diffusion layers are formed may overlap with a region for the recess.

Also, the recess may be formed over the diffusion layers.

Also, the gate insulating film may be formed to be thicker on the diffusion layers than in the recess.

Also, the ion implantation may be carried out before the gate electrode film is deposited after the gate electrode is formed, and the diffusion layers may be formed to be adjacent to the recess.

Also, the method may be achieved by further flattening the gate electrode film before the ion implantation is carried out after the gate electrode film is deposited.

Also, the method may be achieved by further adjusting impurity concentration in a surface of the recess.

In another aspect of the present invention, a semiconductor device includes a semiconductor substrate in which a recess is formed; a gate insulating film formed on a surface of the semiconductor substrate and a surface of the recess; a gate electrode formed on the gate insulating film so as to fill the recess; and diffusion layers formed in the semiconductor substrate to be adjacent to the recess.

Here, the gate insulating film is formed to be thicker in the diffusion layers than in the recess.

BRIEF DESCRIPTION OF THE DRAWINGS

FIG. 4 is a cross sectional view showing the structure of the semiconductor device according to the first embodiment;

DESCRIPTION OF THE PREFERRED EMBODIMENTS

Hereinafter, a semiconductor device and a manufacturing method thereof according to the present invention will be described with reference to the attached drawings. The semiconductor device according to the present invention is a recess channel transistor having a gate electrode formed in a groove region (recess) of the semiconductor substrate. The recess channel transistor is used for a DRAM memory cell, for example.

First Embodiment

Figure 3A:
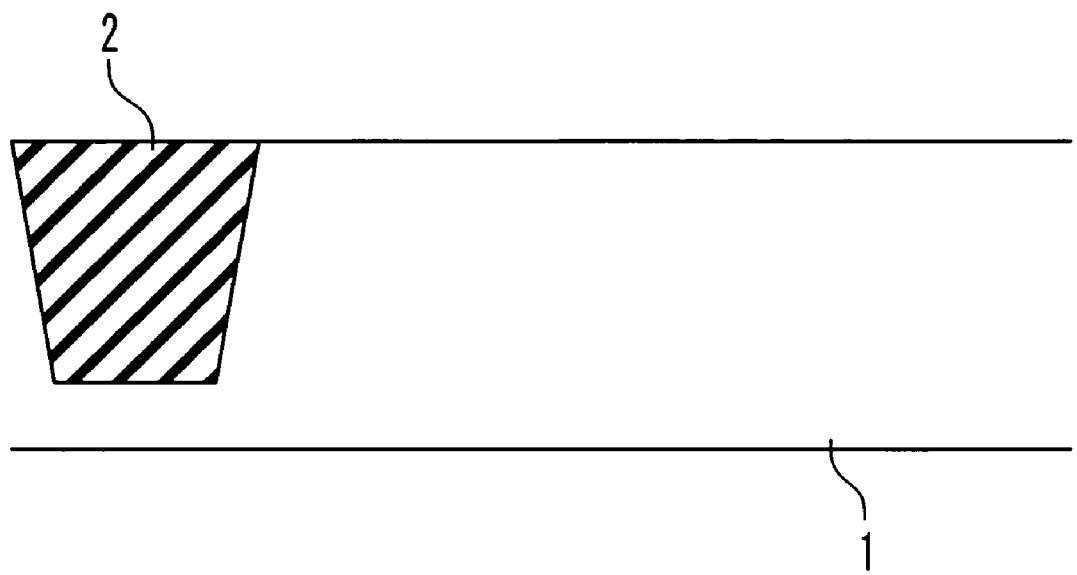
FIGS. 3A to 3F are cross sectional views showing a method of manufacturing a semiconductor device according to a first embodiment of the present invention.

FIGS. 3A to 3F are cross sectional views showing a method of manufacturing the recess channel transistor according to the first embodiment of the present invention. As shown in FIG. 3A, an element isolation structure 2 is first formed in a semiconductor substrate 1. The semiconductor substrate 1 is, for example, a P-type silicone substrate 1. The element isolation structure 2 has an STI (Shallow Trench Isolation) structure with a depth of about 250 nm.

Figure 3B:
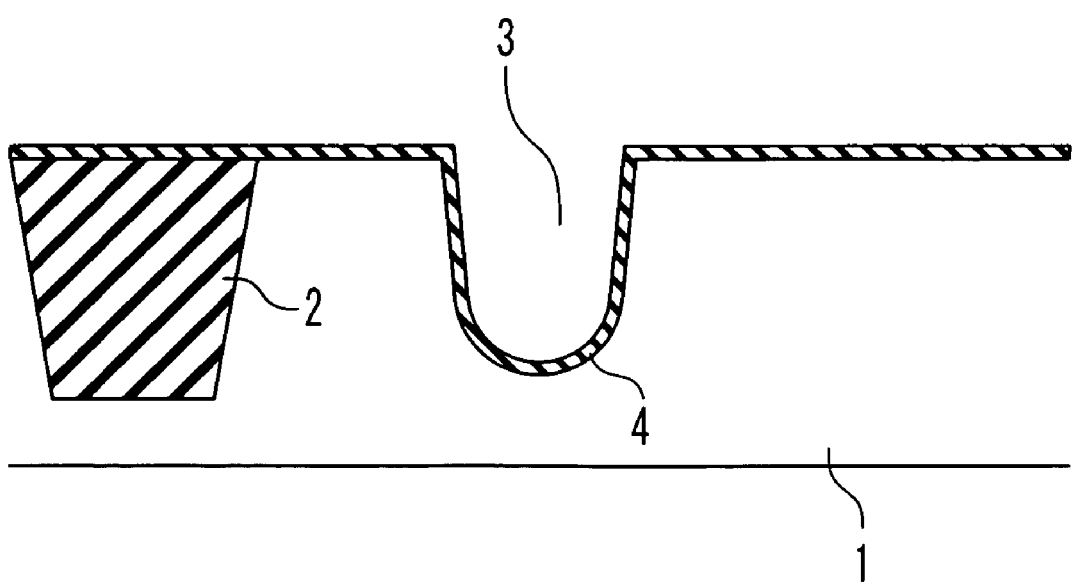

Next, as shown in FIG. 3B, a recess 3 of a groove shape is formed in a predetermined region of the semiconductor substrate 1. The recess 3 with the depth of about 150 nm is formed by using a lithography technique and a dry etching technique. A region in which the recess 3 is formed corresponds to a channel region of the transistor. Subsequently, boron ions are doped from an upper direction to a lower direction by an ion implantation method in the semiconductor substrate 1 in the vicinity of a bottom of the recess 3 so as to adjust the threshold voltage Vt. A dose amount is about $1 \times 10^{12}/cm^2$ to $1 \times 10^{13}/cm^2$. Subsequently, a gate insulating film 4 is formed by a thermal oxidization method on a surface of the semiconductor substrate 1 and a surface of the recess 3. This gate insulating film 4 has the film thickness of about 7 nm.

Figure 3C:
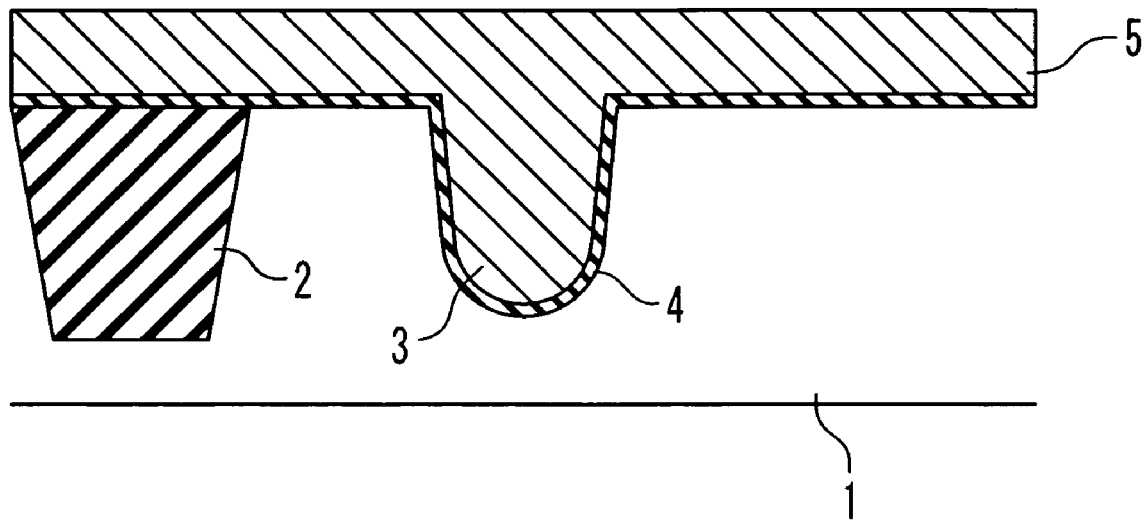

Next, as shown in FIG. 3C, a gate polysilicon film 5 is deposited on the gate insulating film 4 by a CVD method. This gate polysilicon film 5 functions as a gate electrode, and is formed of a phosphor-doped polysilicon (DOPOS). The gate polysilicon film 5 has the film thickness of 50 nm to 100 nm. The gate polysilicon film 5 is formed on a whole surface, and the recess 3 is filled with the gate polysilicon film 5 at least. That is, the gate polysilicon film 5 completely fills in an inside of the recess 3. Once the gate polysilicon film 5 has been deposited, the surface of the gate polysilicon film 5 is flattened.

Figure 3D:
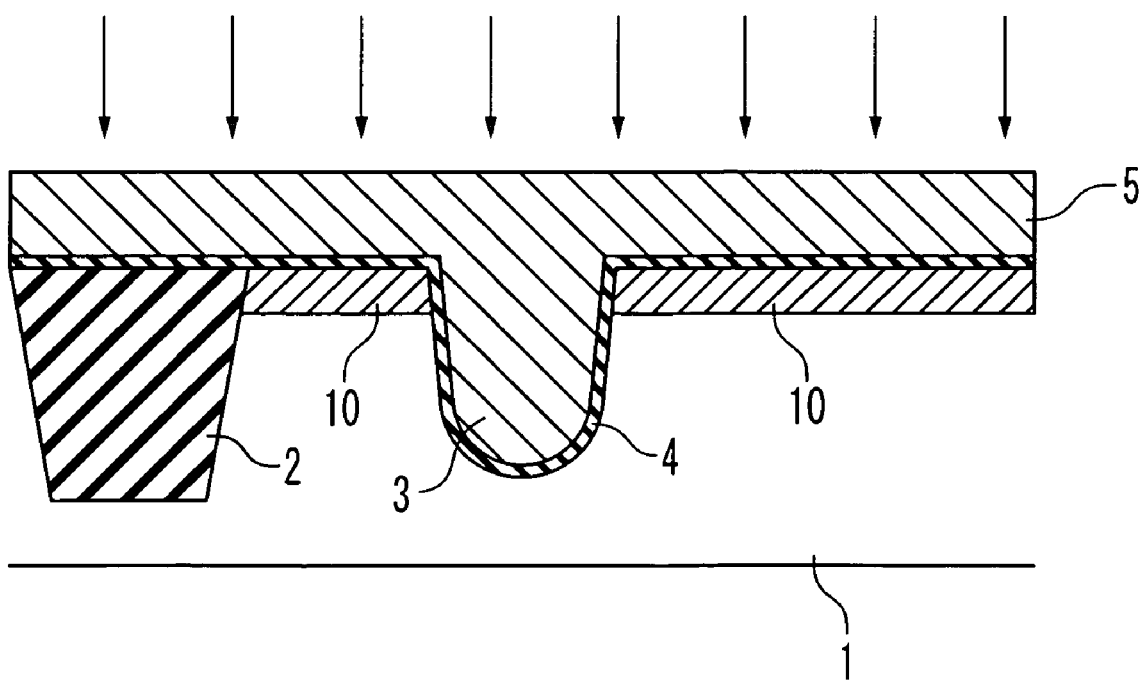

Next, as shown in FIG. 3D, impurity ions are implanted in the semiconductor substrate 1 through the flattened gate polysilicon film 5 by the ion implantation method. Arsenic or phosphorous ions can be used as the impurity ions. Energy of the impurity ions to be implanted is about 100 keV with a dose amount of $5 \times 10^{13}/cm^2$ to $5 \times 10^{14}/cm^2$. This ion implantation forms N-type diffusion layers (source/drain regions) 10 so as to be in contact to or be adjacent to the recess 3 such that the diffusion layers 10 extend along the substrate surface from the recess. That is, the diffusion layers 10 can be formed in the semiconductor substrate 1 on both sides of the recess 3 in a self alignment manner with the recess 3. Because the impurity ions are implanted through the gate polysilicon film 5, it is also preferable that the surface of the gate polysilicon film 5 is flattened in parallel to the surface of the semiconductor substrate 1 as shown in FIG. 3C.

Figure 3E:
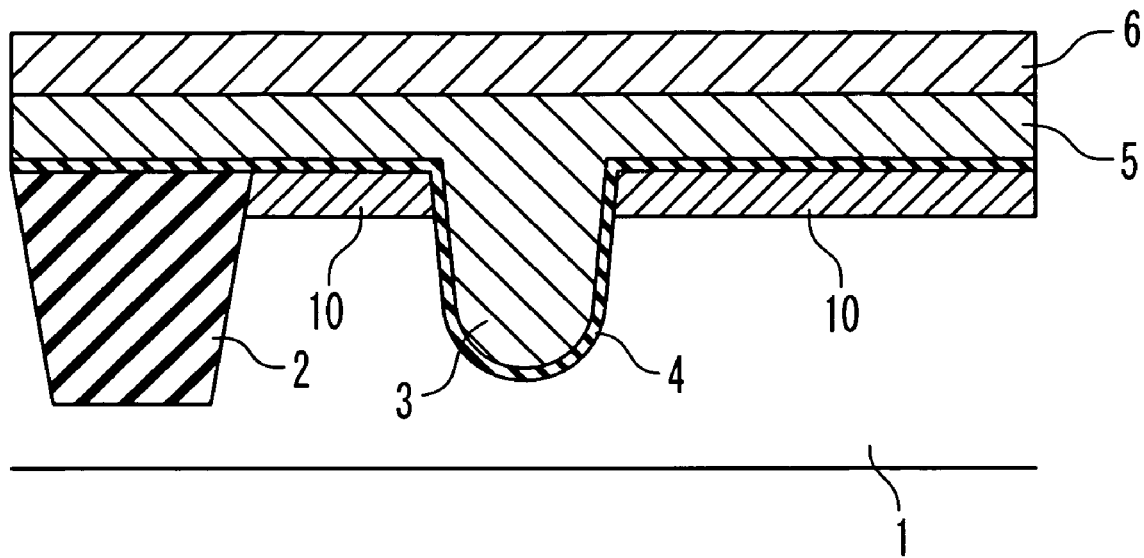
Figure 3F:
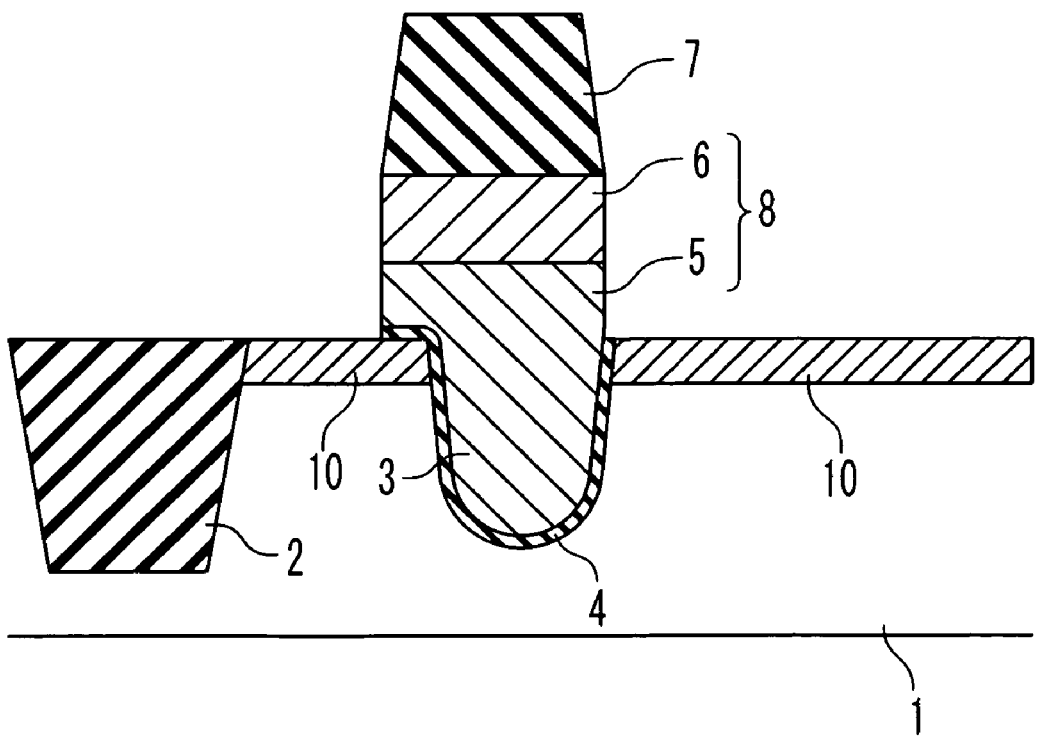

Next, as shown in FIG. 3E, a gate silicide film 6 is deposited on the gate polysilicon film 5 by a PVD method or a CVD method. The gate silicide film 6 is exemplified by silicide of high melting point metal such as WSi and CoSi. Or, a film of high melting point metal such as W and Co may be formed in place of the gate silicide film 6, and then a thermal process may be carried out. The silicide film and the metal film play a role to reduce a contact resistance with the gate electrode (word line). Thereafter, as shown in FIG. 3F, a resist mask 7 is formed on the gate silicide film 6. This resist mask 7 is formed above the recess 3 (channel region). The gate silicide film 6, the gate polysilicon film 5 and the gate insulating film 4 are removed from a region other than the resist mask 7 by a dry etching using the resist mask 7. As a result, a gate electrode 8 is formed of the gate polysilicon film 5 and the gate silicide film 6. The formed gate electrode 8 protrudes from the semiconductor substrate 1 and an upper surface thereof is positioned higher than a surface of the semiconductor substrate 1. In other words, a part of the gate electrode 8 fills the recess 3 and an inside of the recess 3 is filled with the gate electrode 8 at least.

A structure of a recess channel transistor is obtained as shown in FIG. 4 when the resist mask 7 is removed. A channel is formed in such a manner to round a substrate region on a bottom side of the recess 3. Therefore, a substantial channel length can be elongated or extended while an element area is maintained. Accordingly, a short channel effect is suppressed. The recess 3 is expected to have the depth of about 150 nm from the substrate surface, and the gate length is expected to be equal to or shorter than 100 nm.

Figure 1A:
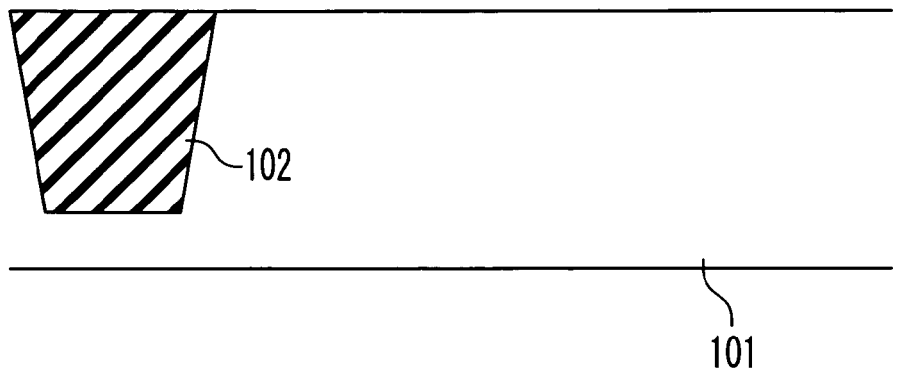
FIGS. 1A to 1E are cross sectional views showing a conventional method of manufacturing a semiconductor device.
Figure 1B:
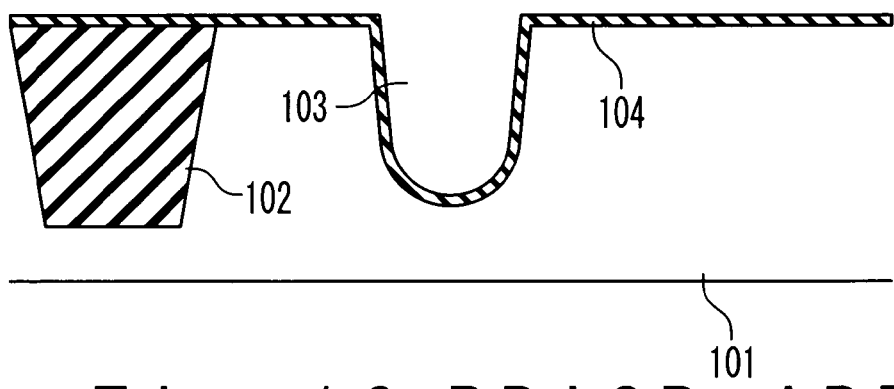
Figure 1C:
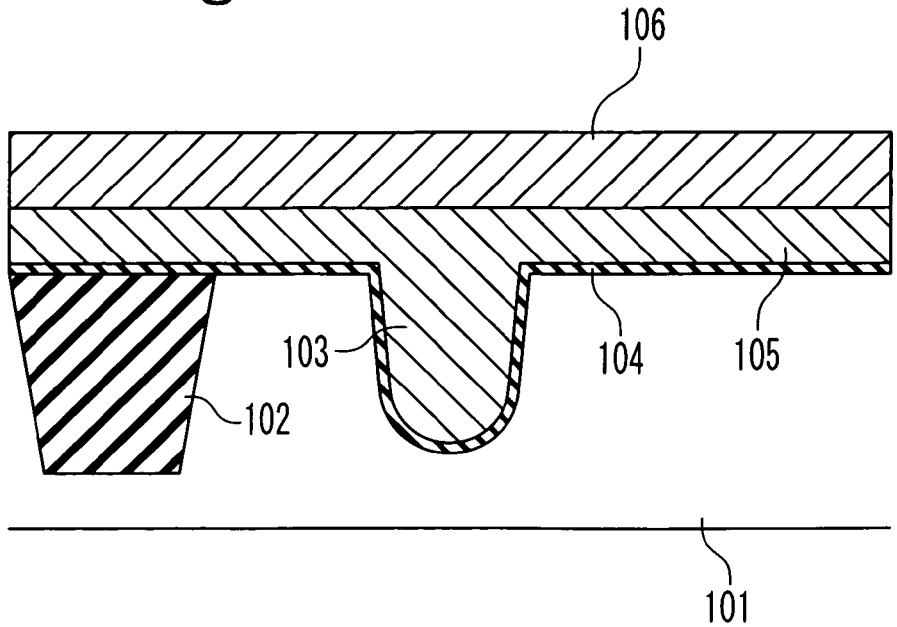
Figure 1D:
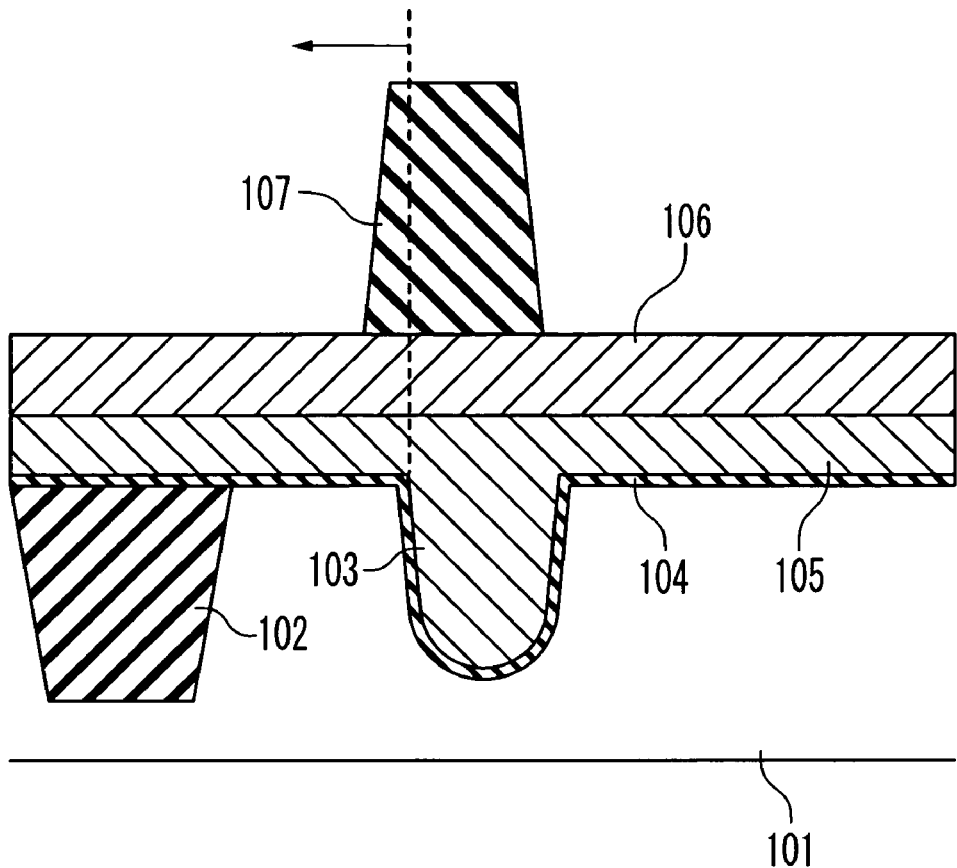
Figure 1E:
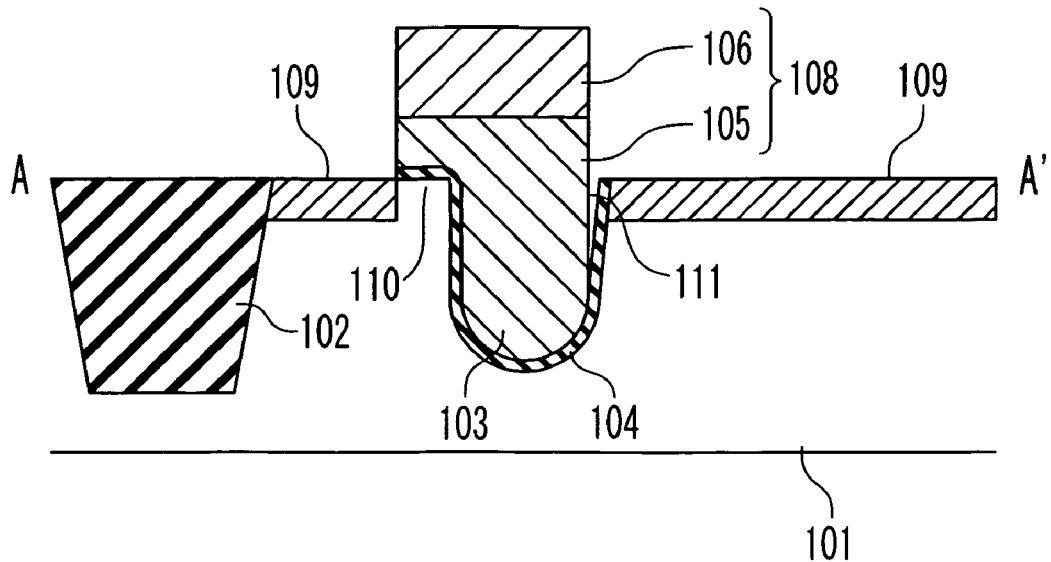
Figure 2:
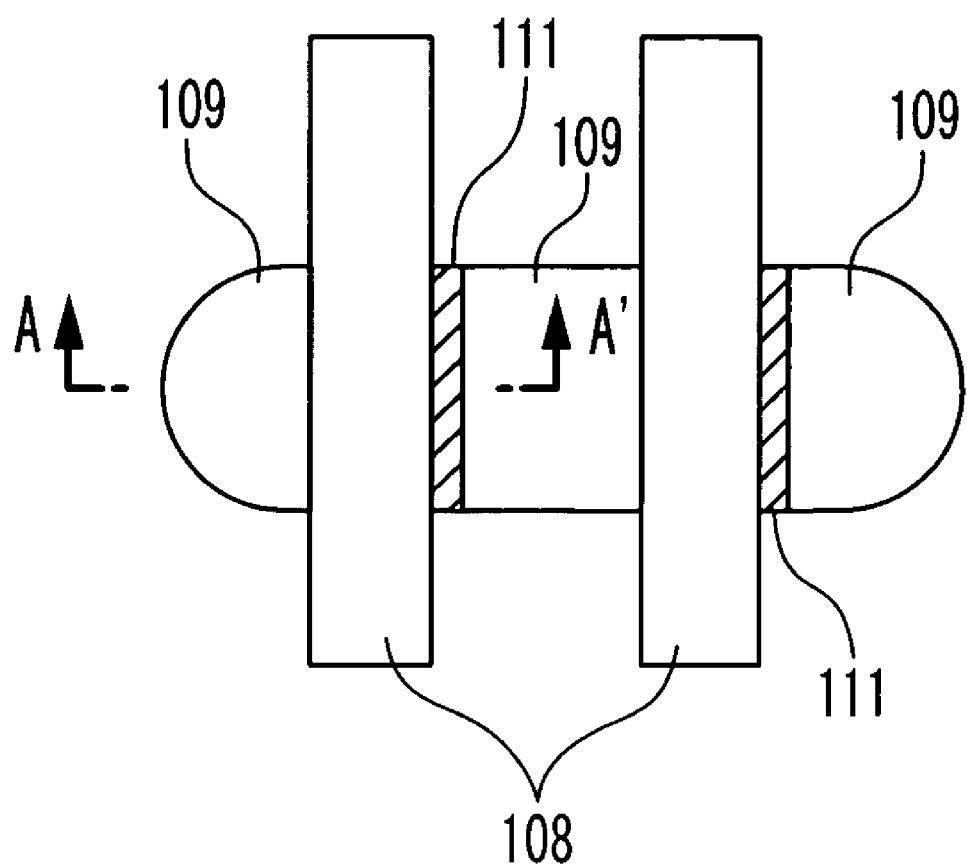
FIG. 2 is a plane view showing the structure of the conventional semiconductor device.

As shown in FIG. 4, the diffusion layers 10 in the semiconductor substrate 1 are formed to be adjacent to the recess 3. Specifically, the diffusion layers 10 are formed in a self alignment with respect to the recess 3, thereby the generation of an offset region as shown in FIG. 1E is prevented. This prevents deterioration of a recess transistor performance and deviation of the threshold voltage Vt, and suppression of the junction leakage current is realized. That is, the deterioration in characteristics of the recess channel transistor is prevented.

Second Embodiment

Timing when ions are implanted to form the diffusion layers 10 in the second embodiment of the present invention is different from that of the first embodiment. More specifically, the ion implantation to form the diffusion layers 10 is carried out before forming the recess 3. A more detailed manufacturing process will be described referring to FIGS. 5A to 5F. The description in the first embodiment will not be repeated and appropriately omitted.

Figure 5A:
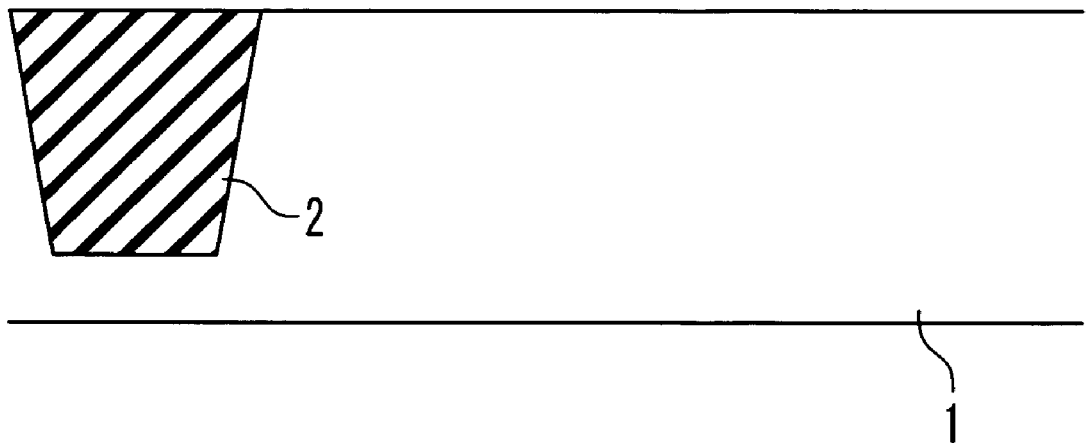
FIGS. 5A to 5F are cross sectional views showing the method of manufacturing the semiconductor device according to a second embodiment of the present invention.
Figure 5B:
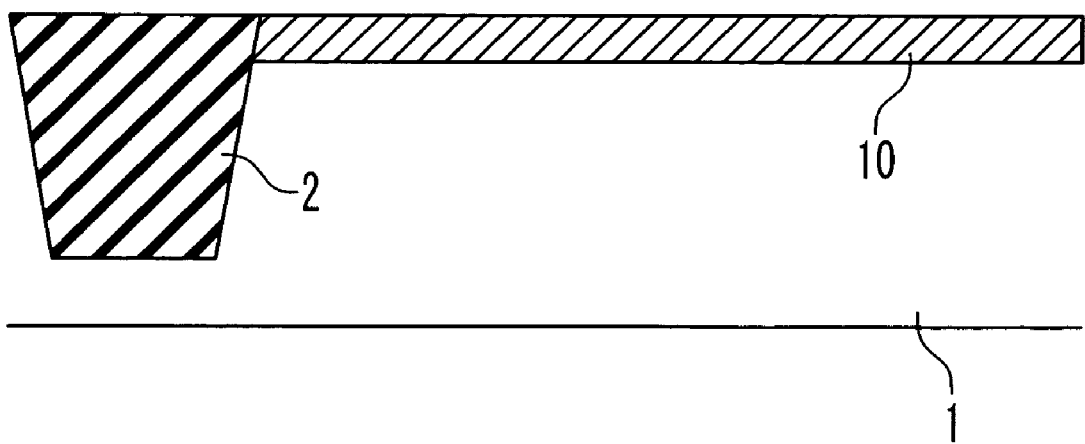

As shown in FIG. 5A, the element isolation structure 2 such as an STI structure is first formed in the semiconductor substrate 1. Then, impurity ions are implanted in the semiconductor substrate 1 by the ion implantation method to form the diffusion layers 10 on a surface region of the semiconductor substrate 1, as shown in FIG. 5B. Arsenic or phosphorus ions are used as the impurity ions. An impurity concentration in the diffusion layer 10 is about $1 \times 10^{13}/cm^3$. A part of a region in which the diffusion layers 10 are formed is same as a region in which the recess is formed later.

Figure 5C:
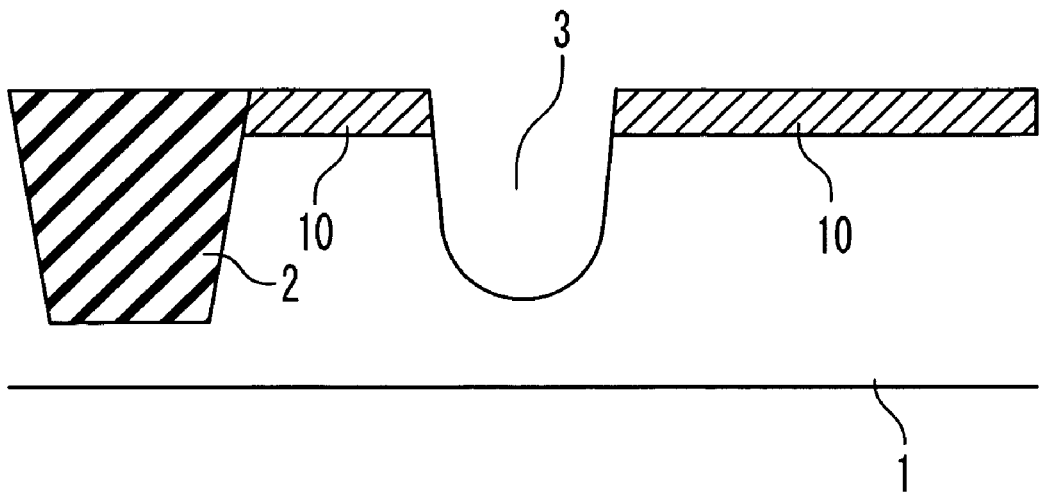

Next, as shown in FIG. 5C, the recess 3 of a groove shape is formed in a predetermined region of the semiconductor substrate 1. A region in which the recess 3 is formed corresponds to the channel region of the transistor. The recess 3 is formed over the diffusion layers 10. Therefore, it is possible to form the diffusion layer 10 and the recess 3 in the self alignment manner. The diffusion layers (source/drain regions) 10 remaining in the semiconductor substrate 1 are made adjacent to or contact with the recess 3. Subsequently, the boron ions are doped in the semiconductor substrate 1 in a vicinity of the bottom of the recess 3 by the ion implantation method to adjust the threshold voltage Vt through concentration adjustment.

Figure 5D:
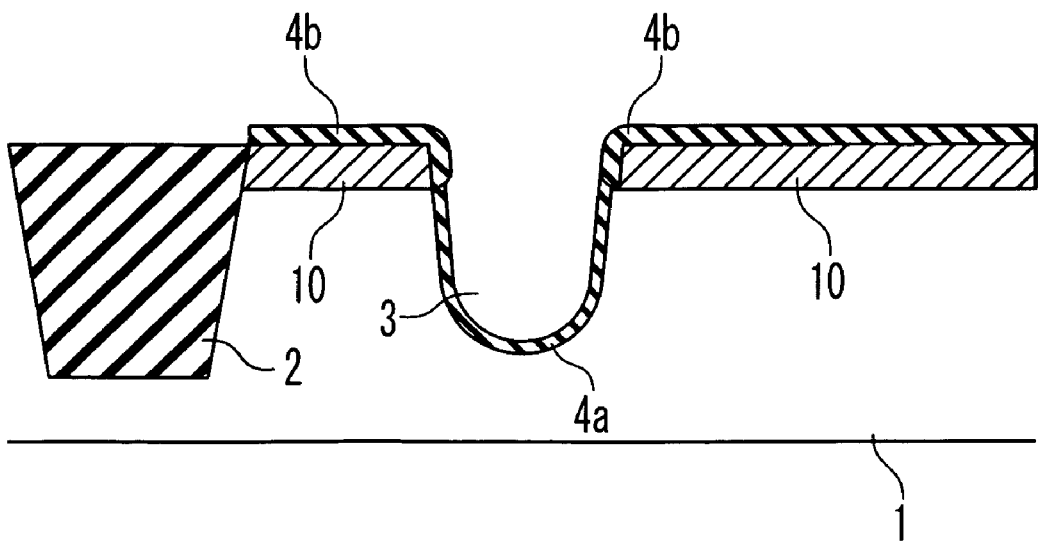

Subsequently, as shown in FIG. 5D, the gate insulating film 4 is formed on a whole surface by the thermal oxidization method. An oxidization ratio of the diffusion layer 10 is larger than that of the semiconductor substrate 1. Therefore, in comparison between the gate insulating film 4a formed on the substrate surface inside the recess 3 and the gate insulating film 4b formed on the surface of the diffusion layer 10, the gate insulating film 4b is formed to have a thickness greater than that of the gate insulating film 4a. That is, the gate insulating films 4b in the source/drain regions are made thicker than the gate insulating film 4a in the channel region.

Figure 5E:
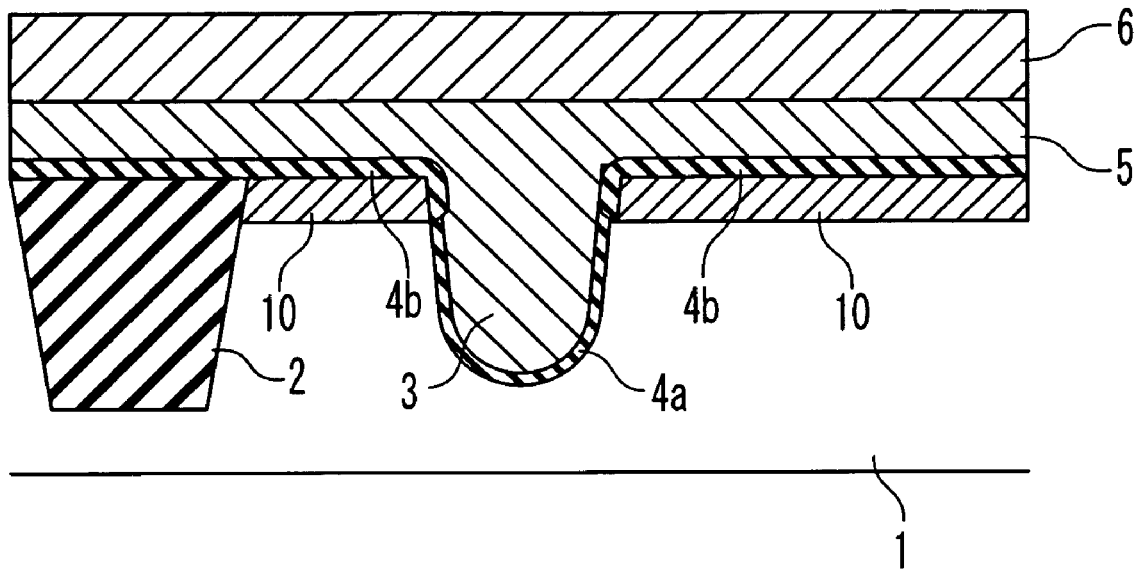
Figure 5F:
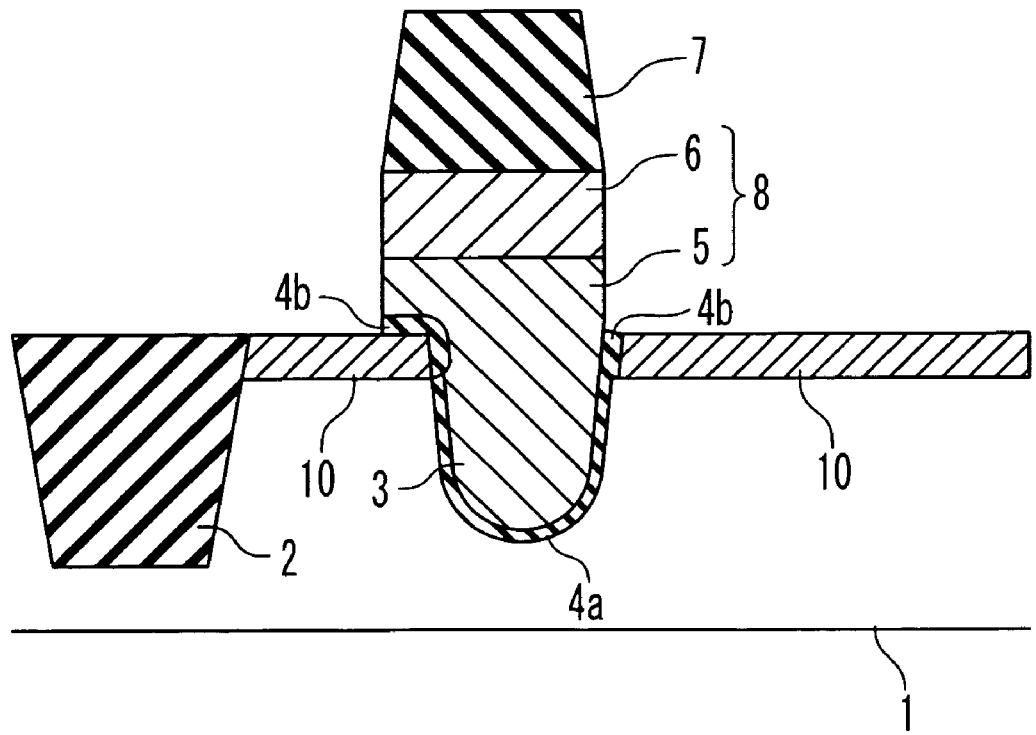

Next, as shown in FIG. 5E, the gate polysilicon film (DO-POS) 5 as the gate electrode material film is deposited on the gate insulating films 4a and 4b. The gate polysilicon film 5 is formed on a whole surface, and the recess 3 is filled with the gate polysilicon film 5 at least. Once the gate polysilicon film 5 has been deposited, a surface of the gate polysilicon film 5 is flattened. Subsequently, the gate silicide film 6 is deposited such as WSi and CoSi on the gate polysilicon film 5. A film of high melting point metal such as W and Co may be formed in place of the gate silicide film 6. Subsequently, the resist mask 7 is formed above the recess 3 (channel region) as shown in FIG. 5F. As a result of the dry etching using the resist mask 7, the gate electrode 8 is formed of the gate polysilicon film 5 and the gate silicide film 6. The formed gate electrode 8 protrudes from the semiconductor substrate 1 and an upper surface thereof is positioned higher than the surface of the semiconductor substrate 1. In other words, a part of the gate electrode 8 fills in the recess 3, and an inside of the recess 3 is filled with the gate electrode 8 at least.

Figure 6:
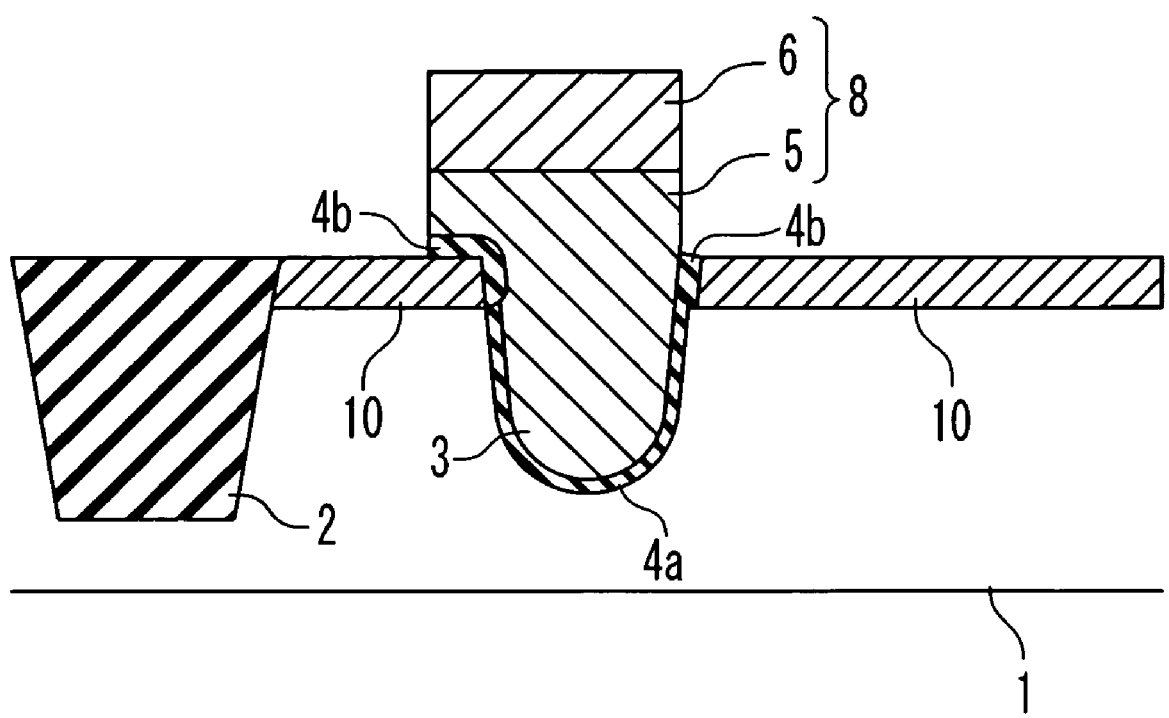
FIG. 6 is a cross sectional view showing the structure of the semiconductor device according to the second embodiment.

A structure of a recess channel transistor is obtained as shown in FIG. 6 when the resist mask 7 is removed. Similar to the first embodiment, the diffusion layers 10 in the semiconductor substrate 1 are formed to be adjacent to the recess 3. That is, the diffusion layer 10 is formed in the self alignment manner with respect to the recess 3, and generation of an offset region as shown in FIG. 1E is prevented. Therefore, the reduction of the recess transistor performance and the deviation of the threshold voltage Vt are prevented, and the suppression of the joint leak current is realized. That is, the deterioration in characteristics of the recess channel transistor is prevented.

Furthermore, according to the present embodiment, the gate insulating films 4b on the diffusion layers 10 (source/drain regions) are formed to have a thickness greater than that of the gate insulating film 4a of the channel region. That is, the source/drain regions 10 are insulated from the gate electrode 8 by the thick oxide film 4b. Accordingly, an additional effect to improve a gate breakdown voltage is obtained. The existence of the thick oxide film 4b also extends a margin in the etching process when the gate electrode 8 is formed. Thus, a merit to secure a margin to avoid substrate damage in performing the gate etching.

According to a manufacturing method of a semiconductor device of the present invention, it is possible to form diffusion layers and a recess (channel) in a recess channel transistor in a self alignment manner. Accordingly, generation of an offset region or a slit region is prevented. Therefore, the deterioration in characteristics of the recess channel transistor is prevented.

What is claimed is:

1. A method of manufacturing a semiconductor device, comprising:
    forming a recess in a semiconductor substrate;
    forming a gate insulating film on a surface of said semiconductor substrate and a surface of said recess;
    depositing a gate electrode film on said gate insulating film to fill said recess;
    forming a gate electrode by etching said gate electrode film by using a predetermined mask; and
    carrying out ion implantation into said semiconductor substrate to form diffusion layers extending from said recess to form source and drain regions, after said depositing the gate electrode film before said forming the gate electrode.

2. The method according to claim 1, further comprising:
    flattening said gate electrode film before said ion implantation is carried out after said gate electrode film is deposited.

3. The method according to claim 1, further comprising:
    adjusting impurity concentration along a surface of said recess.

* * * * *